(12) United States Patent
Wang et al.

(10) Patent No.: US 11,511,760 B2
(45) Date of Patent: Nov. 29, 2022

(54) CROSS-PLATFORM CONTROL PROFILING TOOL FOR AUTONOMOUS VEHICLE CONTROL

(71) Applicants: Baidu USA LLC, Sunnyvale, CA (US); Baidu.com Times Technology (Beijing) Co., Ltd., Beijing (CN)

(72) Inventors: Yu Wang, Sunnyvale, CA (US); Qi Luo, Sunnyvale, CA (US); Yu Cao, Sunnyvale, CA (US); Zongbao Feng, Beijing (CN); Longtao Lin, Sunnyvale, CA (US); Xiangquan Xiao, Sunnyvale, CA (US); Jinghao Miao, Sunnyvale, CA (US); Jiangtao Hu, Sunnyvale, CA (US); Jingao Wang, Sunnyvale, CA (US); Shu Jiang, Suunyvale, CA (US); Jinyun Zhou, Sunnyvale, CA (US); Jiaxuan Xu, Sunnyvale, CA (US)

(73) Assignees: BAIDU USA LLC, Sunnyvale, CA (US); BAIDU.COM TIMES TECHNOLOGY (BEIJING) CO., LTD., Beijing (CN)

( * ) Notice: Subject to any disclaimer, the term of this patent is extended or adjusted under 35 U.S.C. 154(b) by 108 days.

(21) Appl. No.: 16/643,154

(22) PCT Filed: Jan. 23, 2020

(86) PCT No.: PCT/CN2020/073970
§ 371 (c)(1),
(2) Date: Feb. 28, 2020

(87) PCT Pub. No.: WO2021/147071
PCT Pub. Date: Jul. 29, 2021

(65) Prior Publication Data
US 2021/0229678 A1    Jul. 29, 2021

(51) Int. Cl.
*B60W 40/105* (2012.01)
*G06F 16/23* (2019.01)
(Continued)

(52) U.S. Cl.
CPC ....... *B60W 40/105* (2013.01); *G06F 16/2322* (2019.01); *G06F 16/9035* (2019.01);
(Continued)

(58) Field of Classification Search
CPC ..... B60W 2050/0028; B60W 2556/10; B60W 2050/0075; B60W 2520/105; B60W 2520/125; G06F 16/9035; G06F 16/2322
See application file for complete search history.

(56) References Cited

U.S. PATENT DOCUMENTS 10,459,444 B1 * 10/2019 Kentley-Klay ...... G05D 1/0027
11,273,836 B2 * 3/2022 Zheng ............. B60W 30/18163
(Continued)

*Primary Examiner* — Jeff A Burke
*Assistant Examiner* — Jerrod Irvin Davis
(74) *Attorney, Agent, or Firm* — Womble Bond Dickinson (US) LLP

(57) ABSTRACT

Systems and methods are disclosed for collecting driving data from simulated autonomous driving vehicle (ADV) driving sessions and real-world ADV driving sessions. The driving data is processed to exclude manual (human) driving data and to exclude data corresponding to the ADV being stationary (not driving). Data can further be filtered based on driving direction: forward or reverse driving. Driving data records are time stamped. The driving data can be aligned according to the timestamp, then a standardized set of metrics is generated from the collected, filtered, and time-aligned data. The standardized set of metrics are used to grade the performance the control system of the ADV, and to generate an updated ADV controller, based on the standardized set of metrics.

21 Claims, 10 Drawing Sheets

(51) Int. Cl.
  G06F 16/9035 (2019.01)
  B60W 50/00 (2006.01)
(52) U.S. Cl.
  CPC .............. *B60W 2050/0075* (2013.01); *B60W 2520/105* (2013.01); *B60W 2520/125* (2013.01); *B60W 2556/10* (2020.02)

(56) References Cited

U.S. PATENT DOCUMENTS

| | | | |
|---|---|---|---|
| 11,364,936 B2* | 6/2022 | Graves | B60W 30/18159 |
| 2018/0105186 A1* | 4/2018 | Motomura | B60W 50/00 |
| 2018/0292830 A1* | 10/2018 | Kazemi | G05D 1/0221 |
| 2018/0339712 A1* | 11/2018 | Kislovskiy | H04W 4/021 |
| 2018/0365533 A1* | 12/2018 | Sathyanarayana | B60W 30/095 |
| 2020/0249675 A1* | 8/2020 | Kim | G06K 9/6262 |
| 2020/0377111 A1* | 12/2020 | Misu | G06F 11/3058 |
| 2020/0406894 A1* | 12/2020 | Akella | G01S 13/865 |
| 2021/0114617 A1* | 4/2021 | Phillips | G01C 21/3453 |
| 2021/0221386 A1* | 7/2021 | Quirynen | G05B 17/02 |
| 2021/0237769 A1* | 8/2021 | Ostafew | B60W 60/00274 |

* cited by examiner

CROSS-PLATFORM CONTROL PROFILING TOOL FOR AUTONOMOUS VEHICLE CONTROL

CROSS-REFERENCE TO RELATED APPLICATION

This patent application is a U.S. National Phase Application under 35 U.S.C. § 371 of International Application No. PCT/CN2020/073970, filed Jan. 23, 2020, entitled "CROSS-PLATFORM CONTROL PROFILING TOOL FOR AUTONOMOUS VEHICLE CONTROL," which is incorporated by reference herein by its entirety.

TECHNICAL FIELD

Embodiments of the present disclosure relate generally to operating autonomous vehicles. More particularly, embodiments of the disclosure relate to a uniform and systematic process for—improving autonomous vehicle control systems.

BACKGROUND

Vehicles operating in an autonomous mode (e.g., driverless) can relieve occupants, especially the driver, from some driving-related responsibilities. When operating in an autonomous mode, the vehicle can navigate to various locations using onboard sensors, allowing the vehicle to travel with minimal human interaction or in some cases without any passengers.

Motion planning and control are critical operations in autonomous driving. However, conventional motion planning operations estimate the difficulty of completing a given path mainly from its curvature and speed, without considering the differences in features for different types of vehicles. Same motion planning and control is applied to all types of vehicles, which may not be accurate and smooth under some circumstances.

Improving an autonomous vehicle control system requires quantitative analysis of road test data (and/or simulation data) on each functional module of an autonomous vehicle control system, including perception, localization, planning, and control, and especially for the control system. Currently, quantitative analysis of an autonomous vehicle control system is performed by manual selection of features to analyze and by non-uniform analysis methods. Such manual analysis is time-consuming, incomplete, and is not uniform between iterations. Currently, there is a lack of systematic, comprehensive, and automatic test data profiling tools for autonomous vehicle control systems.

DISCLOSURE

Embodiments of the present disclosure provide a computer-implemented method of improving an autonomous driving vehicle (ADV) control system, a non-transitory machine-readable medium and a data processing system.

Embodiments of a first aspect of the present disclosure provide a computer-implemented method of improving an autonomous driving vehicle (ADV) control system, comprising: extracting, from driving records of a plurality of ADVs, driving records for a specified ADV type having a specified ADV controller type; filtering the extracted driving records to exclude driving records representing manual driving and to exclude driving records representing a stationary state of an ADV in the plurality of ADVs; generating a set of standardized metrics, each metric representing a performance characteristic of an ADV controller having the specified ADV controller type for the specified ADV type; and using the set of standardized metrics to generate an updated ADV controller having the specified ADV controller type; and distributing the updated ADV controller of the specified ADV controller type to one or more ADVs of the ADV type, for use in driving the one or more ADVs.

In an embodiment, the plurality of ADVs includes one or more simulated ADVs of a simulation system, each simulated ADV having the an ADV type and an ADV controller type corresponding to a real ADV in the plurality of ADVs.

In an embodiment, the extracted driving records are further filtered to include driving records corresponding to a gearshift position of the ADV, wherein the gearshift position comprises one of a forward gear or a reverse gear position.

In an embodiment, the stationary state of the ADV is determined by at least one of: a gearshift position of the ADV being one of neutral or park; or a speed of the ADV being zero.

In an embodiment, the method further comprises: aligning the extracted driving records for each ADV in the plurality of ADVs according to a timestamp of each extracted driving record.

In an embodiment, for each ADV in the plurality of ADVs, the extracted records of driving data comprise: controller outputs to controlled systems of the ADV, including throttle, brakes, and steering, and including measured states of the controlled systems responsive to the controller outputs; state information of the chassis of the ADV, including pitch, roll, ADV incline, and forward and lateral acceleration; and location information indicating a planned location and heading of the ADV and an actual location and heading of the ADV, at a timestamp of the location information.

In an embodiment, the method further comprises: generating visualization information from the extracted data records; and providing the visualization information to at least one of: a system that generates a report including plots and histograms of the visualization information; or a simulation system that generates one or more charts, histograms, or plots for display on the simulation system, using the visualization information.

In an embodiment, the method further comprises: generating one or more suggested updates to the ADV controller, based upon the generated set of standardized metrics.

In an embodiment, the method further comprises: running, one or more times, a simulated ADV on a simulation system using the updated ADV controller; and generating a new set of standardized metrics based upon driving records generated by rerunning the one or more simulations.

Embodiments of a second aspect provide a non-transitory machine-readable medium. The non-transitory machine-readable medium has instructions stored therein, which when executed by a processor, cause the processor to perform any of the methods described in the embodiments of the first aspect.

Embodiments of a third aspect provide a data processing system, comprising: a processor; and a memory coupled to the processor to store instructions, which when executed by the processor, cause the processor to perform any of the methods described in the embodiments of the first aspect.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
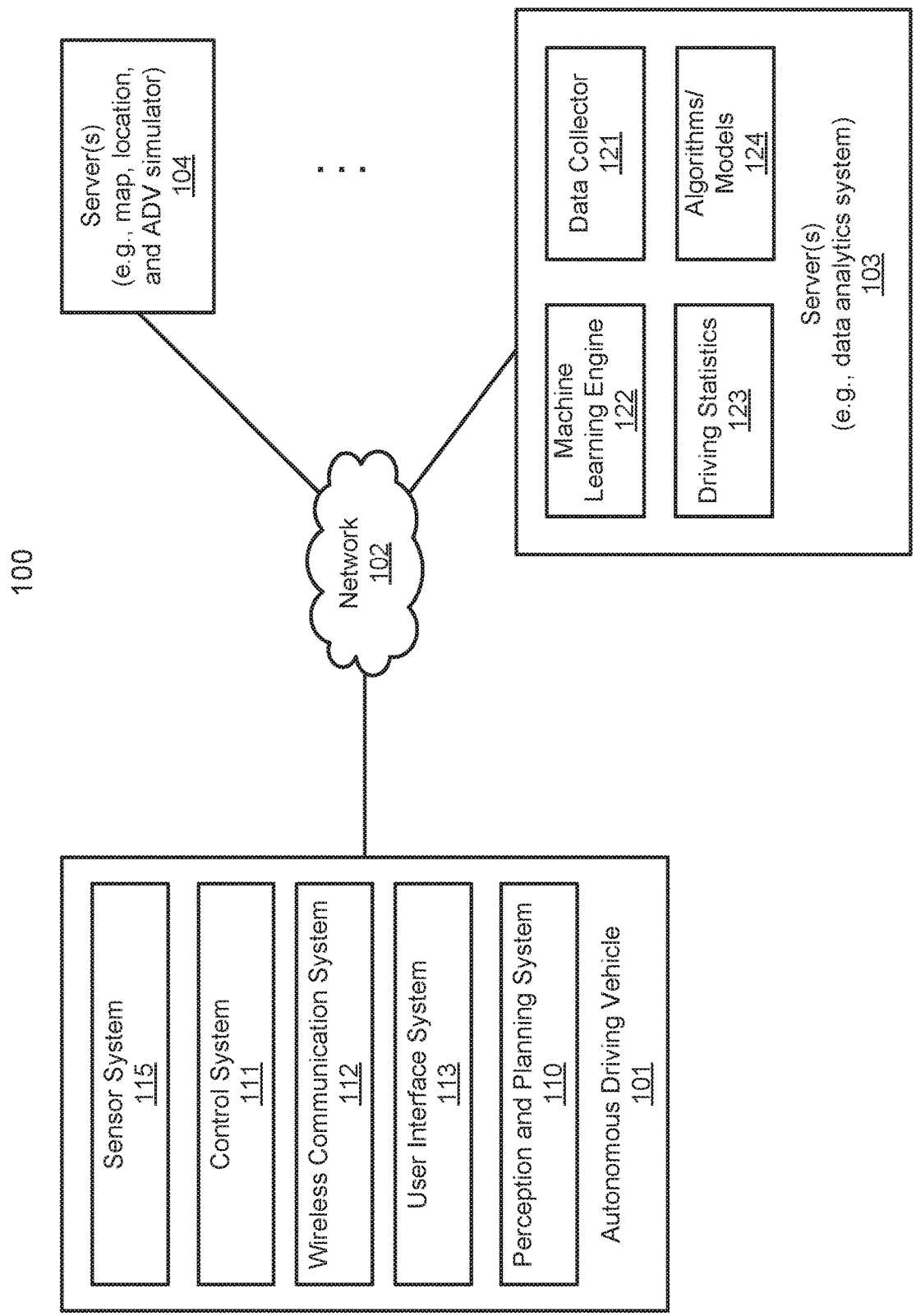
FIG. 1 is a block diagram illustrating a networked system according to one embodiment.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to some embodiments, a computer-implemented method of improving an autonomous driving vehicle (ADV) control system includes extracting, from driving records of a plurality of ADVs, driving records for a specified ADV type having a specified ADV controller type. An ADV type can include various makes and models of vehicles that have been fitted with autonomous driving controller systems. An ADV controller type can include the hardware that implements the ADV controller, software modules having identified version and build information that implement ADV controller logic, and one or more ADV controller models, such as a model predictive controller (MPC), or a linear quadratic regulator (LQR). The driving records are filtered to exclude driving records representing manual driving and to exclude driving records representing a stationary state of an ADV in the plurality of ADVs. One or more of the ADVs in the plurality of ADVs can be a simulated ADV of a driving simulation system. In an embodiment, an ADV is stationary if a gearshift of the ADV is in a "park" position or a "neutral" position, or if the speed of the ADV is zero kilometers (km) or miles (m) per hour. The driving records may further be filtered in records based on the gearshift position being a forward gear or a reverse driving gear. The driving records can be aligned and ordered according to a timestamp of each driving record. In an embodiment, the driving records for a particular ADV in the plurality of ADVs are processed before driving records of another ADV in the plurality of ADVs. Driving records can be generated by a real-world ADV or an ADV of a driving simulation system ("simulated ADV"). Driving records can include controller outputs to controlled systems of the ADV, including throttle, brakes, and steering, and including measured states of the controlled systems responsive to the controller outputs; state information of the chassis of the ADV, including pitch, roll, ADV incline, and forward and lateral acceleration, and states of controlled systems such as brakes, throttle, and steering, in response to the controller outputs; and location information indicating a planned location and heading of the ADV and an actual location and heading of the ADV, at a timestamp of the location information.

From the filtered and timestamp-aligned driving records, the controller profiling system will generate raw data and a set of standardized metrics the specified ADV type and specified ADV controller type. The raw data can be used to generate plots and histogram showing, visually representing the raw data. In an embodiment, raw data can be stored in a file format such as hierarchical data format (HDF), e.g HDF5 or HDF5. Analysis of the standardized controller performance metrics can performed manually, e.g. by design and test engineers, or can be performed by the controller profiling system. The set of standardized metrics can be used to generate an updated ADV controller having the specified ADV controller type. In an embodiment, the set of standardized ADV controller performance metrics and/or visualizations of raw data can be automatically distributed a predetermined distribution list of recipients, e.g. via email, and/or distributed to an ADV driving simulation system that can generate plots and histograms of the raw data and standardized metrics. In an embodiment, the controller profiling system can suggest improvements to an ADV controller, provide an updated controller, and iteratively run simulations using the updated controller, wherein each iteration generates driving records for the ADV type and ADV controller type, which may then be used to generate raw data and standardized performance metrics for the updated ADV controller.

In another embodiment, an ADV driving simulation system can generate and automatically upload ADV driving records from driving simulations performed on the ADV driving simulation system. The ADV driving simulation system can receive a selection of an ADV type to simulate. In an embodiment, an ADV controller type for the ADV can also be selected, such as for testing an ADV controller performance and/or comparing the ADV controller performance to an updated version of the ADV controller. A route for the ADV to drive can be selected and run. During the running of the simulated ADV driving, a driving data logger of the ADV simulated driving system can log driving data records of the same type, format, and nature as for a real-world ADV of the same ADV type and ADV controller type. At the end of the simulated driving route, the ADV driving simulation system can automatically upload driving records for the simulated driving route to the controller profiling system. In an embodiment, the ADV driving simulation system can request that raw data and a set of standardized metrics be produced so that the performance of the ADV controller type can be analyzed.

In another embodiment, a real-world ADV can generate and upload ADV driving records to the ADV controller profiling system. In an embodiment, ADV driving records can be uploaded automatically from the ADV to the ADV controller profiling system at a particular time, or uploaded in response to a user input selecting a time to upload the ADV driving records. In an embodiment, a user can select an event that triggers the uploading of driving records, such as at the end of driving a route, or after completing driving of a plurality of routes, or in response to receiving a user input to upload driving records to the ADV controller profiling system. In an embodiment, when an ADV is operating using an ADV driving interface such as Baidu® Dreamland, the ADV can be programmed to upload ADV driving records after 100% of a desired ADV driving data set has been collected.

In yet another embodiment, the ADV controller profiling system can distribute an updated ADV controller having an ADV controller type to one or more ADVs, including both simulated and real-world ADVs. The updated ADV controller can be based upon an analysis of the ADV controller profiling system set of standardized metrics.

In an embodiment, any/all of the above method functionality can be implemented by a processing system, comprising one or more hardware processors coupled to a memory programmed with executable instructions that, when executed by the processing system, cause a computing system to implement the claimed functionality. In an embodiment, the memory can be a non-transitory computer-readable medium or other type of memory.

FIG. 1 is a block diagram illustrating an autonomous vehicle network configuration according to one embodiment of the disclosure. Referring to FIG. 1, network configuration 100 includes autonomous vehicle 101 that may be communicatively coupled to one or more servers 103-104 over a network 102. Although there is one autonomous vehicle shown, multiple autonomous vehicles can be coupled to each other and/or coupled to servers 103-104 over network 102. Network 102 may be any type of networks such as a local area network (LAN), a wide area network (WAN) such as the Internet, a cellular network, a satellite network, or a combination thereof, wired or wireless. Server(s) 103-104 may be any kind of servers or a cluster of servers, such as Web or cloud servers, application servers, backend servers, or a combination thereof. Servers 103-104 may be data analytics servers, content servers, traffic information servers, map and point of interest (MPOI) servers, simulated autonomous vehicle driving servers, or location servers, etc. An autonomous vehicle driving simulator server 104 can include data logging of driving records substantially identical to the data logging of a real autonomous driving vehicle. The driving simulator can be used to test proposed updates to autonomous vehicle control systems. The driving simulator can upload its driving records for processing by, e.g., server 103 algorithms 124 to generate a set of standardized metrics 124 that characterize performance of the autonomous vehicle control system.

An autonomous vehicle 101 refers to a vehicle that can be configured to be driven in an autonomous mode in which the vehicle navigates through an environment with little or no input from a driver. Such an autonomous vehicle can include a sensor system having one or more sensors that are configured to detect information about the environment in which the vehicle operates. The vehicle and its associated controller(s) use the detected information to navigate through the environment. Autonomous vehicle 101 can operate in a manual mode, a full autonomous mode, or a partial autonomous mode. As described herein, in some embodiments, an autonomous vehicle is simulated in an autonomous driving simulator of server 104. Characteristics and identifiers, such as an autonomous vehicle type (e.g. Lexus®, Honda®, SmartCar®, Kia®, et al.) and an autonomous vehicle controller type (e.g. model predictive control, or linear quadratic regulator) can be used to identify simulated autonomous vehicles within a autonomous driving simulation system and driving records generated by a simulated autonomous vehicle driving session.

In one embodiment, autonomous vehicle 101 includes, but is not limited to, perception and planning system 110, vehicle control system 111, wireless communication system 112, user interface system 113, and sensor system 115. Autonomous vehicle 101 may further include certain common components included in ordinary vehicles, such as, an engine, wheels, steering wheel, transmission, etc., which may be controlled by vehicle control system 111 and/or perception and planning system 110 using a variety of communication signals and/or commands, such as, for example, acceleration signals or commands, deceleration signals or commands, steering signals or commands, braking signals or commands, etc.

Components 110-115 may be communicatively coupled to each other via an interconnect, a bus, a network, or a combination thereof. For example, components 110-115 may be communicatively coupled to each other via a controller area network (CAN) bus. A CAN bus is a vehicle bus standard designed to allow microcontrollers and devices to communicate with each other in applications without a host computer. It is a message-based protocol, designed originally for multiplex electrical wiring within automobiles, but is also used in many other contexts.

Figure 2:
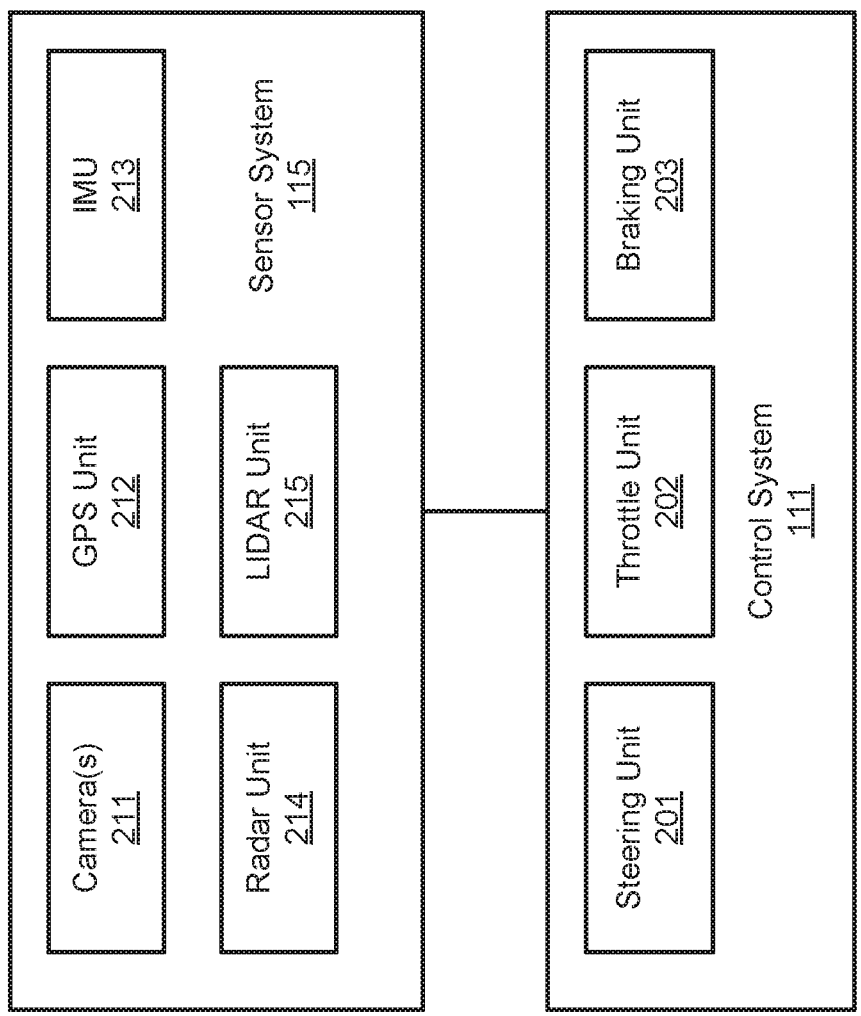
FIG. 2 is a block diagram illustrating an example of an autonomous vehicle according to one embodiment.

Referring now to FIG. 2, in one embodiment, sensor system 115 includes, but it is not limited to, one or more cameras 211, global positioning system (GPS) unit 212, inertial measurement unit (IMU) 213, radar unit 214, and a light detection and range (LIDAR) unit 215. GPS system 212 may include a transceiver operable to provide information regarding the position of the autonomous vehicle. IMU unit 213 may sense position and orientation changes of the autonomous vehicle based on inertial acceleration. Radar unit 214 may represent a system that utilizes radio signals to sense objects within the local environment of the autonomous vehicle. In some embodiments, in addition to sensing objects, radar unit 214 may additionally sense the speed and/or heading of the objects. LIDAR unit 215 may sense objects in the environment in which the autonomous vehicle is located using lasers. LIDAR unit 215 could include one or more laser sources, a laser scanner, and one or more detectors, among other system components. Cameras 211 may include one or more devices to capture images of the environment surrounding the autonomous vehicle. Cameras 211 may be still cameras and/or video cameras. A camera may be mechanically movable, for example, by mounting the camera on a rotating and/or tilting a platform.

Sensor system 115 may further include other sensors, such as, a sonar sensor, an infrared sensor, a steering sensor, a throttle sensor, a braking sensor, and an audio sensor (e.g., microphone). An audio sensor may be configured to capture sound from the environment surrounding the autonomous vehicle. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor.

In one embodiment, vehicle control system 111 includes, but is not limited to, steering unit 201, throttle unit 202 (also referred to as an acceleration unit), and braking unit 203. Steering unit 201 is to adjust the direction or heading of the vehicle. Throttle unit 202 is to control the speed of the motor or engine that in turn controls the speed and acceleration of the vehicle. Braking unit 203 is to decelerate the vehicle by providing friction to slow the wheels or tires of the vehicle. Note that the components as shown in FIG. 2 may be implemented in hardware, software, or a combination thereof.

Referring back to FIG. 1, wireless communication system 112 is to allow communication between autonomous vehicle 101 and external systems, such as devices, sensors, other vehicles, etc. For example, wireless communication system 112 can wirelessly communicate with one or more devices directly or via a communication network, such as servers 103-104 over network 102. Wireless communication system 112 can use any cellular communication network or a wireless local area network (WLAN), e.g., using WiFi to communicate with another component or system. Wireless communication system 112 could communicate directly with a device (e.g., a mobile device of a passenger, a display device, a speaker within vehicle 101), for example, using an infrared link, Bluetooth, etc. User interface system 113 may be part of peripheral devices implemented within vehicle 101 including, for example, a keyboard, a touch screen display device, a microphone, and a speaker, etc.

Some or all of the functions of autonomous vehicle 101 may be controlled or managed by perception and planning system 110, especially when operating in an autonomous driving mode. Perception and planning system 110 includes the necessary hardware (e.g., processor(s), memory, storage) and software (e.g., operating system, planning and routing programs) to receive information from sensor system 115, control system 111, wireless communication system 112, and/or user interface system 113, process the received information, plan a route or path from a starting point to a destination point, and then drive vehicle 101 based on the planning and control information. Alternatively, perception and planning system 110 may be integrated with vehicle control system 111.

For example, a user as a passenger may specify a starting location and a destination of a trip, for example, via a user interface. Perception and planning system 110 obtains the trip related data. For example, perception and planning system 110 may obtain location and route information from an MPOI server, which may be a part of servers 103-104. The location server provides location services and the MPOI server provides map services and the POIs of certain locations. Alternatively, such location and MPOI information may be cached locally in a persistent storage device of perception and planning system 110.

While autonomous vehicle 101 is moving along the route, perception and planning system 110 may also obtain real-time traffic information from a traffic information system or server (TIS). Note that servers 103-104 may be operated by a third party entity. Alternatively, the functionalities of servers 103-104 may be integrated with perception and planning system 110. Based on the real-time traffic information, MPOI information, and location information, as well as real-time local environment data detected or sensed by sensor system 115 (e.g., obstacles, objects, nearby vehicles), perception and planning system 110 can plan an optimal route and drive vehicle 101, for example, via control system 111, according to the planned route to reach the specified destination safely and efficiently.

Autonomous driving vehicle (ADV) 101 can generate and log driving records that capture data from the subsystems, e.g. sensor system 115, control system 111, and perception and planning system 110. The driving records can be uploaded to a server, e.g. server 103, for storage by data collector 121. A cross-platform control profiling system, stored in e.g. server 103 algorithms and models 124, can analyze driving records from a large plurality of ADVs and simulated ADVs.

Server 103 may be a data analytics system to perform data analytics services for a variety of clients. In one embodiment, data analytics system 103 includes data collector 121 and machine learning engine 122. Data collector 121 collects driving statistics 123 from a variety of vehicles, either autonomous vehicles or regular vehicles driven by human drivers. Driving statistics 123 include information indicating the driving commands (e.g., throttle, brake, steering commands) issued and responses of the vehicles (e.g., speeds, accelerations, decelerations, directions) captured by sensors of the vehicles at different points in time. Driving statistics 123 may further include information describing the driving environments at different points in time, such as, for example, routes (including starting and destination locations), MPOIs, road conditions, weather conditions, etc.

Based on driving statistics 123, machine learning engine 122 generates or trains a set of rules, algorithms, and/or predictive models 124 for a variety of purposes. In one embodiment, algorithms 124 may include a cross-platform control profiling system that generates a set of standardized statistics, or metrics, 123 characterizing performance of an autonomous driving control system of the ADV using ADV driving data and simulated ADV driving data ("cross-platform" meaning both real and simulated ADV driving records). Raw driving data records are uploaded from an ADV at a specified time, or manually, to data collector 121. Simulated ADV driving data is also uploaded to data collector 121. Algorithms 124 are used to generate the set of standardized metrics characterizing the performance of the ADV control system. The Algorithm 124 takes advantages of statistical methodologies to build the computation equations of the metrics, and calculated the results (scores) corresponding to these metrics. The computed results (scores) of the metrics are stored in driving statistics 123, and distributed to the pre-defined design engineers or subscribed customers in the format of both the text and visualization (plotting), as the performance evaluation results of the current control system and also, the standards of the iterative-design of the developing control system.

Figure 3A:
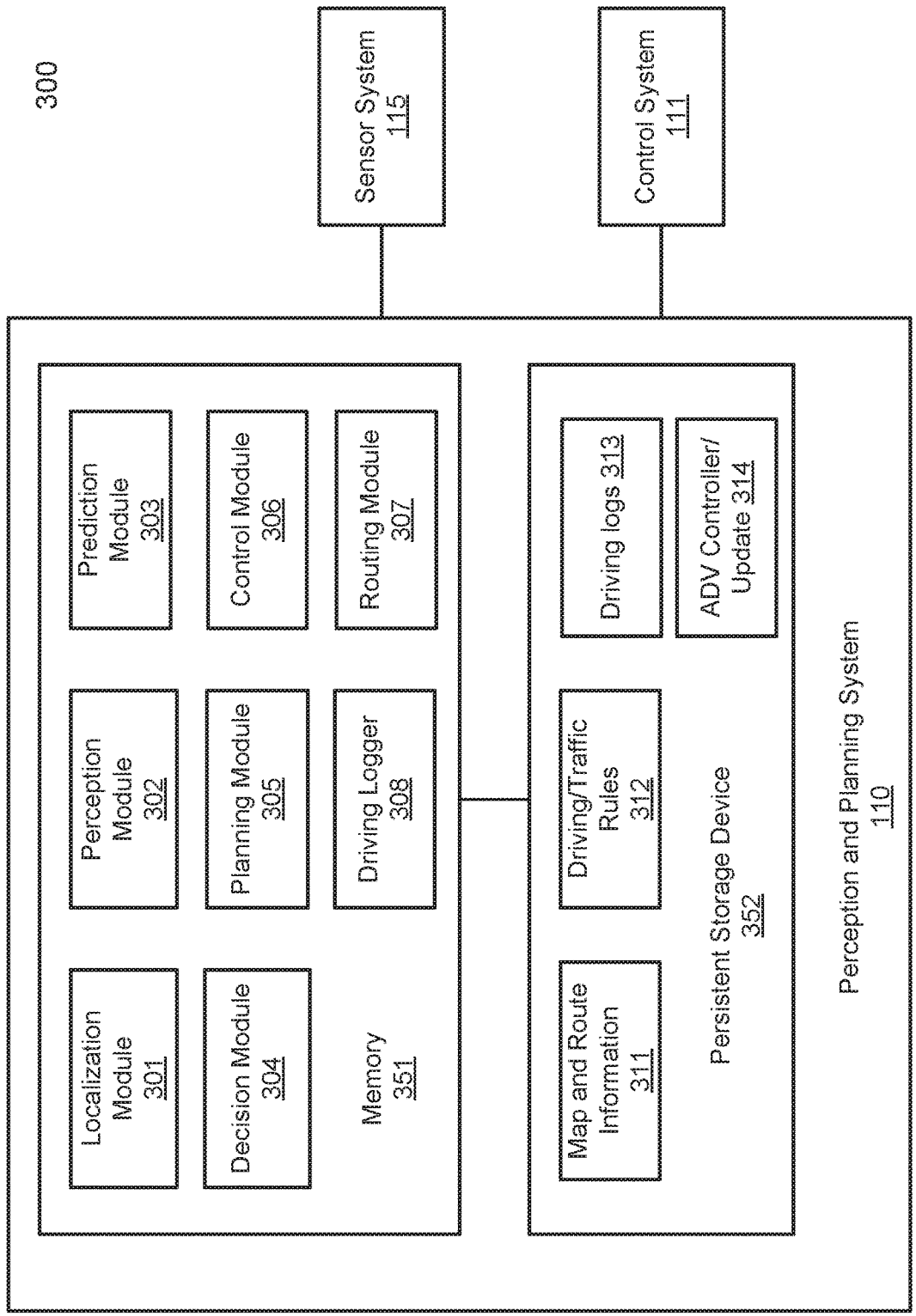
FIGS. 3A and 3B are block diagrams illustrating an example of a perception and planning system used with an autonomous vehicle according to one embodiment.
Figure 3B:
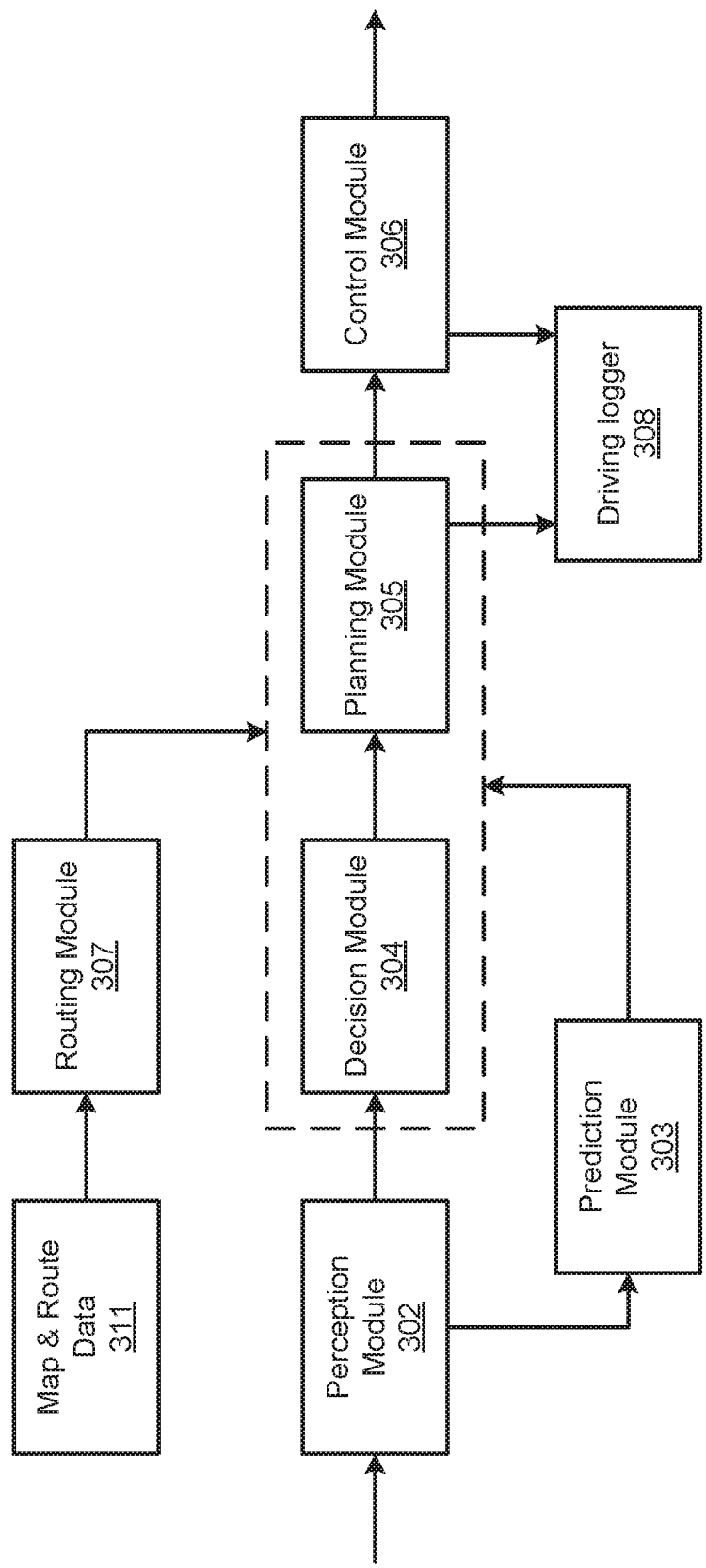

FIGS. 3A and 3B are block diagrams illustrating an example of a perception and planning system used with an autonomous vehicle according to one embodiment. System 300 may be implemented as a part of autonomous vehicle 101 of FIG. 1 including, but is not limited to, perception and planning system 110, control system 111, and sensor system 115. Referring to FIGS. 3A-3B, perception and planning system 110 includes, but is not limited to, localization module 301, perception module 302, prediction module 303, decision module 304, planning module 305, control module 306, routing module 307, and driving logger 308.

Some or all of modules 301-308 may be implemented in software, hardware, or a combination thereof. For example, these modules may be installed in persistent storage device 352, loaded into memory 351, and executed by one or more processors (not shown). Note that some or all of these modules may be communicatively coupled to or integrated with some or all modules of vehicle control system 111 of FIG. 2. Some of modules 301-308 may be integrated together as an integrated module.

Localization module 301 determines a current location of autonomous vehicle 300 (e.g., leveraging GPS unit 212) and manages any data related to a trip or route of a user. Localization module 301 (also referred to as a map and route module) manages any data related to a trip or route of a user. A user may log in and specify a starting location and a destination of a trip, for example, via a user interface. Localization module 301 communicates with other components of autonomous vehicle 300, such as map and route information 311, to obtain the trip related data. For example, localization module 301 may obtain location and route information from a location server and a map and POI (MPOI) server. A location server provides location services and an MPOI server provides map services and the POIs of certain locations, which may be cached as part of map and route information 311. While autonomous vehicle 300 is moving along the route, localization module 301 may also obtain real-time traffic information from a traffic information system or server.

Based on the sensor data provided by sensor system 115 and localization information obtained by localization module 301, a perception of the surrounding environment is determined by perception module 302. The perception information may represent what an ordinary driver would perceive surrounding a vehicle in which the driver is driving. The perception can include the lane configuration, traffic light signals, a relative position of another vehicle, a pedestrian, a building, crosswalk, or other traffic related signs (e.g., stop signs, yield signs), etc., for example, in a form of an object. The lane configuration includes information describing a lane or lanes, such as, for example, a shape of the lane (e.g., straight or curvature), a width of the lane, how many lanes in a road, one-way or two-way lane, merging or splitting lanes, exiting lane, etc.

Perception module 302 may include a computer vision system or functionalities of a computer vision system to process and analyze images captured by one or more cameras in order to identify objects and/or features in the environment of autonomous vehicle. The objects can include traffic signals, road way boundaries, other vehicles, pedestrians, and/or obstacles, etc. The computer vision system may use an object recognition algorithm, video tracking, and other computer vision techniques. In some embodiments, the computer vision system can map an environment, track objects, and estimate the speed of objects, etc. Perception module 302 can also detect objects based on other sensors data provided by other sensors such as a radar and/or LIDAR.

For each of the objects, prediction module 303 predicts what the object will behave under the circumstances. The prediction is performed based on the perception data perceiving the driving environment at the point in time in view of a set of map/rout information 311 and traffic rules 312. For example, if the object is a vehicle at an opposing direction and the current driving environment includes an intersection, prediction module 303 will predict whether the vehicle will likely move straight forward or make a turn. If the perception data indicates that the intersection has no traffic light, prediction module 303 may predict that the vehicle may have to fully stop prior to enter the intersection. If the perception data indicates that the vehicle is currently at a left-turn only lane or a right-turn only lane, prediction module 303 may predict that the vehicle will more likely make a left turn or right turn respectively.

For each of the objects, decision module 304 makes a decision regarding how to handle the object. For example, for a particular object (e.g., another vehicle in a crossing route) as well as its metadata describing the object (e.g., a speed, direction, turning angle), decision module 304 decides how to encounter the object (e.g., overtake, yield, stop, pass). Decision module 304 may make such decisions according to a set of rules such as traffic rules or driving rules 312, which may be stored in persistent storage device 352.

Routing module 307 is configured to provide one or more routes or paths from a starting point to a destination point. For a given trip from a start location to a destination location, for example, received from a user, routing module 307 obtains route and map information 311 and determines all possible routes or paths from the starting location to reach the destination location. Routing module 307 may generate a reference line in a form of a topographic map for each of the routes it determines from the starting location to reach the destination location. A reference line refers to an ideal route or path without any interference from others such as other vehicles, obstacles, or traffic condition. That is, if there is no other vehicle, pedestrians, or obstacles on the road, an ADV should exactly or closely follows the reference line. The topographic maps are then provided to decision module 304 and/or planning module 305. Decision module 304 and/or planning module 305 examine all of the possible routes to select and modify one of the most optimal routes in view of other data provided by other modules such as traffic conditions from localization module 301, driving environment perceived by perception module 302, and traffic condition predicted by prediction module 303. The actual path or route for controlling the ADV may be close to or different from the reference line provided by routing module 307 dependent upon the specific driving environment at the point in time.

Based on a decision for each of the objects perceived, planning module 305 plans a path or route for the autonomous vehicle, as well as driving parameters (e.g., distance, speed, and/or turning angle), using a reference line provided by routing module 307 as a basis. That is, for a given object, decision module 304 decides what to do with the object, while planning module 305 determines how to do it. For example, for a given object, decision module 304 may decide to pass the object, while planning module 305 may determine whether to pass on the left side or right side of the object. Planning and control data is generated by planning module 305 including information describing how vehicle 300 would move in a next moving cycle (e.g., next route/path segment). For example, the planning and control data may instruct vehicle 300 to move 10 meters at a speed of 30 mile per hour (mph), then change to a right lane at the speed of 25 mph.

Based on the planning and control data, control module 306 controls and drives the autonomous vehicle, by sending proper commands or signals to vehicle control system 111, according to a route or path defined by the planning and control data. The planning and control data include sufficient information to drive the vehicle from a first point to a second point of a route or path using appropriate vehicle settings or driving parameters (e.g., throttle, braking, steering commands) at different points in time along the path or route.

In one embodiment, the planning phase is performed in a number of planning cycles, also referred to as driving cycles, such as, for example, in every time interval of 100 milliseconds (ms). For each of the planning cycles or driving cycles, one or more control commands will be issued based on the planning and control data. That is, for every 100 ms, planning module 305 plans a next route segment or path segment, for example, including a target position and the time required for the ADV to reach the target position. Alternatively, planning module 305 may further specify the specific speed, direction, and/or steering angle, etc. In one embodiment, planning module 305 plans a route segment or path segment for the next predetermined period of time such as 5 seconds. For each planning cycle, planning module 305 plans a target position for the current cycle (e.g., next 5 seconds) based on a target position planned in a previous cycle. Control module 306 then generates one or more control commands (e.g., throttle, brake, steering control commands) based on the planning and control data of the current cycle.

Note that decision module 304 and planning module 305 may be integrated as an integrated module. Decision module 304/planning module 305 may include a navigation system or functionalities of a navigation system to determine a driving path for the autonomous vehicle. For example, the navigation system may determine a series of speeds and directional headings to affect movement of the autonomous vehicle along a path that substantially avoids perceived obstacles while generally advancing the autonomous vehicle along a roadway-based path leading to an ultimate destination. The destination may be set according to user inputs via user interface system 113. The navigation system may update the driving path dynamically while the autonomous vehicle is in operation. The navigation system can incorporate data from a GPS system and one or more maps so as to determine the driving path for the autonomous vehicle.

Driving logger 308 records driving records from at least three data channels of the ADV control system: the control channel, the chassis channel, and the localization channel. The control channel produces information about control commands to control systems of the ADV, such as braking, throttle, and steering. The chassis channel produces information from various sensors, such as accelerometers, and readings of actual positions or actuations of the braking, throttle, and steering systems. The localization channel produces information regarding the actual location and heading of the ADV with reference to a standard reference such as a high-definition (HD) map or a global positioning satellite (GPS) system. These three channels are described in detail below with respect to FIG. 5. Data records can be recorded at approximately 100 frames per second (fps), or at about 10 milliseconds (ms) per frame. Each driving record has a timestamp. A timestamp can be an absolute timestamp in the form of hh:mm:ss:ms (hours, minutes, seconds, milliseconds) relative to a start time, such as the start of a driving route. In embodiment, the timestamp can be a frame number, relative to a start time such as the start of the driving route. In an embodiment, each driving record can additional have a date stamp in addition to the time stamp. Data logger 308 can log driving records for simulated ADV driving sessions as well as real-world ADV driving sessions.

Data logger 308 can write the driving records to a non-volatile storage such as driving logs storage 313. Driving logs 313 can be uploaded to a server system, e.g. server(s) 103-104, to generate a set of standardized performance metrics that grade the performance of a controller of the ADV. The controller of the ADV can be updated using the standardized set of metrics, and the updated controller of the ADV can be stored in non-volatile storage 314.

As shown on FIG. 3B, data logger 308 can also receive driving records from the planning module. The planning module driving records can be used to compare planned driving conditions vs. actual (or simulated) driving conditions, to grade the performance of the ADV controller.

Figure 4:
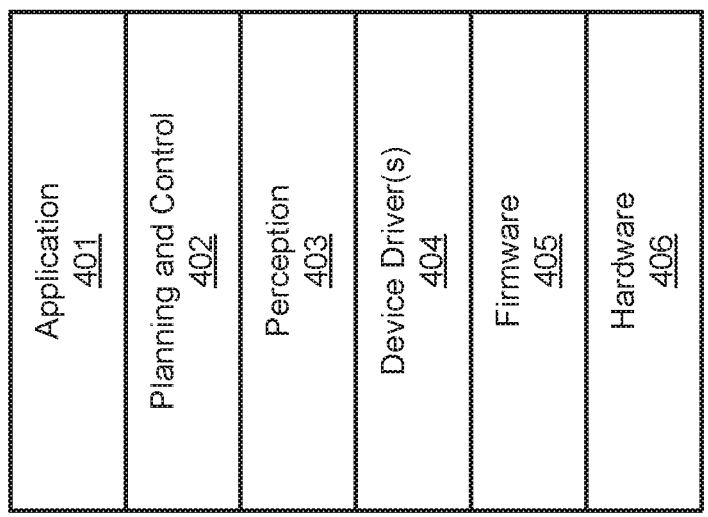
FIG. 4 is a block diagram illustrating architecture of an autonomous driving system according to one embodiment.

FIG. 4 is a block diagram illustrating system architecture for autonomous driving according to one embodiment. System architecture 400 may represent system architecture of an autonomous driving system as shown in FIGS. 3A and 3B. Referring to FIG. 4, system architecture 400 includes, but it is not limited to, application layer 401, planning and control (PNC) layer 402, perception layer 403, driver layer 404, firmware layer 405, and hardware layer 406. Application layer 401 may include user interface or configuration application that interacts with users or passengers of an autonomous driving vehicle, such as, for example, functionalities associated with user interface system 113. PNC layer 402 may include functionalities of at least planning module 305 and control module 306. Perception layer 403 may include functionalities of at least perception module 302. In one embodiment, there is an additional layer including the functionalities of prediction module 303 and/or decision module 304. Alternatively, such functionalities may be included in PNC layer 402 and/or perception layer 403. System architecture 400 further includes driver layer 404, firmware layer 405, and hardware layer 406. Firmware layer 405 may represent at least the functionality of sensor system 115, which may be implemented in a form of a field programmable gate array (FPGA). Hardware layer 406 may represent the hardware of the autonomous driving vehicle such as control system 111. Layers 401-403 can communicate with firmware layer 405 and hardware layer 406 via device driver layer 404.

Figure 5:
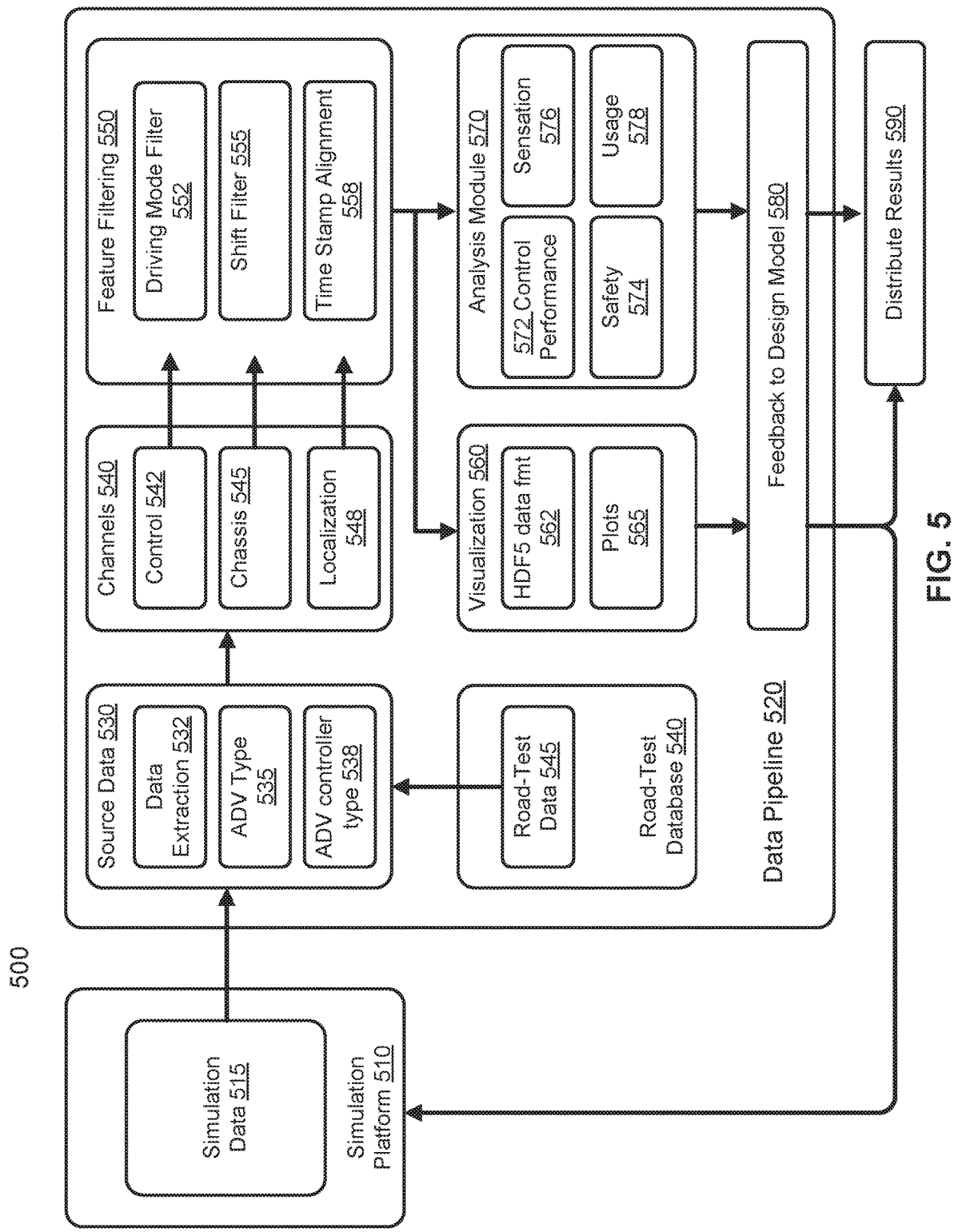
FIG. 5 block diagrams illustrating a data flow and a system that generates standardized performance metrics of an autonomous vehicle controller, for use in improving the autonomous vehicle controller, according to one embodiment.

FIG. 5 illustrates, in block diagram form, a cross-platform control profiling system 500 that generates performance metrics for grading the performance of a control system for an ADV, according to some embodiments. The cross-platform control profiling system 500 can be implemented on, e.g. servers 103-104.

A cross-platform control profiling system (or, "control profiling system") 500 can include a simulation platform 510 and a data pipeline 520. Simulation platform 510 can simulate driving a real-world ADV, including simulating driving of an ADV having an ADV type (e.g. a make, model, revision number of an ADV) and an ADV control system type (or "ADV controller type") of the ADV (e.g. model predictive control, linear quadratic regulator, or hybrid controller type). The ADV control system type can also have a model, hardware revision level, software revision level, build number, serial number, and other identifying information. A particular ADV controller type can be simulated within simulation platform 510 so that simulated driving can simulation produce data 515 driving records that are analogous to real-world ADV "road-test data" 545 driving records. Simulation data 515 can be generated by a driving session of a simulated ADV. The simulation data 515 can be uploaded to data pipeline 520 to generate a set of performance metrics that grade the performance of an ADV control system. In an embodiment, simulation data is automatically uploaded to data pipeline 520 at the end of a simulated driving session.

Data pipeline 520 can include source data 530, data channels 540, feature filtering 550, visualization 560, data analysis module 570, and analysis results distribution 580. Source data 530 can include simulation data 515 driving records and road-test data 545 driving records. Data extraction module 532 can receive selection criteria from a user interface, or from processing job instructions, or other manner of receiving driving data selection criteria. Data extraction 532 can extract driving records from received simulation data 515 and road-test data 545. Data extraction 532 can limit the records extracted to a particular ADV type 535 and a particular ADV controller type 538. An ADV vehicle type 535 can be a vehicle classification (compact, standard, full-size, sports utility vehicle (SUV), or truck) or a particular manufacturing brand, model, and year (e.g. "Honda® Accord 2019). ADV type 535 can include other identifying information that may further identify physical attributes of the specific ADV, such as wheelbase, curb weight, turning radius, engine type (hybrid, electric, diesel, or gasoline), maximum turning angle, horsepower rating, and the like. ADV controller type 538 can include model predictive control (MPC), linear quadratic regulator (LQR), or a hybrid of these. ADV controller type 538 may further include hardware identifiers, software module identifiers, version information, and the like. Source data 530, extracted from simulation data 515 and road-test data 545, and selected based on ADV type 535 and ADV controller type 538, is passed to, and processed by, channels module 540.

Driving data records can be generated by an ADV or simulated ADV at a rate of, e.g. 100 frames per second (100 fps), or at approximate intervals of 10 milliseconds (ms). Driving data records can each have a timestamp that represents a sequential, monotonically increasing value from a start time. In an embodiment, the start time can be related to a real-time clock. In an embodiment, the start time can be related to a first time that the ADV or simulated ADV was powered on or started for a day. In an embodiment, the start time can be related to a start time of a driving session from a start location to an end location. The timestamp can have a granularity of at least 10 ms. In an embodiment, the timestamp can be a monotonically increasing positive integer value that represents a data frame number, as measured from a first frame number. Driving data records may be grouped by channels module 540 into at least three driving records source data channels: control channel 542, chassis channel 545, and localization channel 548.

Control channel 542: Driving records generated by an ADV control channel 542 include information about control systems of the ADV, such as throttle, steering, and braking. Control channel 542 driving records can be generated by a control module of the ADV, e.g. control module 306. Driving records are logged by e.g. driving logger 308. Each driving record can include fields for: a timestamp of the driving record, a throttle control value that is sent to a throttle control system of the ADV, a steering control value sent to the steering control system of the ADV, and a braking control value that is sent to the ADV braking system. A throttle control value can be expressed as a percentage, e.g. 0 . . . 100%. In embodiment, the throttle control value can be expressed as, or converted from the percentage to, e.g. an integer value, such as a 12-bit digital value in the range of 0 . . . 4095. The digital value may be used by a digital to analog convertor (DAC) of the ADV control system to command a throttle system of the ADV. Similarly, a braking value can be expressed as a percentage or a digital value that may be converted by a DAC to an analog value to control the braking system of the ADV. A steering input command can be expressed in degrees, such as ±0 . . . 40° for an amount of steering left or right. In an embodiment, the steering input value can be expressed in radians rather than degrees.

Chassis channel 545: The chassis driving data channel 545 can include sensor output values or readings from a plurality of chassis sensors, including but not limited to: a lateral acceleration sensor, a front/rear acceleration sensor, a vertical acceleration sensor, a pitch sensor, a roll sensor, a position sensor of an actuator of the braking system, a position sensor of an actuator of the throttle system, and a position sensor of the steering system. The lateral acceleration sensor, front/rear acceleration sensor, and vertical acceleration sensor can each have one or more threshold values that are deemed indicative of a level of comfort and/or safety for the passengers of the ADV. Pitch and roll sensors indicate a forward/backward pitching of the chassis or a sideward rolling force about an axis of the ADV, respectively. Pitch and roll values can each have one or more threshold values that are deemed indicative of a level of comfort and/or safety for the passengers of the ADV. The chassis channel 545 can further include actuator sensors for the brake system, throttle system, and steering system to measure an actual position of each system.

Localization channel 548: Localization channel 548 driving data records can include information regarding a location and heading of the ADV with respect to a high-definition (HD) digital map or a global positioning satellite (GPS) system. The localization information can include a planned heading, a planned station along a route, a planned speed, and a planned acceleration, received from a planning system such as planning module 305. Localization channel 548 can further include driving data records indicating an actual heading, an actual station along a planned route, an actual speed, and an actual acceleration of the ADV or simulated ADV.

The above source data 530 from data channels 540 of an ADV are further processed by feature filtering system 550. Feature filtering 550 includes a driving mode filter 552, a shift position filter 555, and a timestamp alignment module 558.

Driving mode filter 552 filters the driving records to include only autonomous driving vehicle mode driving records. Driving records for manual (human) driving mode and for hybrid driving mode (both human and autonomous) are filtered out by driving mode filter 552. Driving mode filter 552 can further filter out driving records indicating an ADV speed of zero, except at an end of route station of the ADV. Station and heading values at the end of a driving route are analyzed by analysis module 570 and are included as driving records, even though the ADV speed at the end of route should be zero. Shift filter 555 also filters the driving records to include, or exclude, driving records based on whether a gear position of the ADV is in a forward driving gear or a reverse driving gear. Shift filter 555 further is configured to exclude driving records when a gearshift position of the ADV is "park" or "neutral."

Timestamp alignment module 558 aligns driving records according to their respective time stamps in preparation for generating the set of controller performance metrics by analysis module 570. For example, for the analysis module 570 to generate a station error metric, "station_err_std," the analysis module 570 computes a difference, at a point in time, between a planned station of the ADV along a trajectory of a route and an actual station of the ADV along the trajectory of the route for a large plurality of station points. Similarly, metrics are generated for heading error, pitch amount, roll amount, speed error, acceleration error, vertical acceleration amount (e.g. "bump"), lateral acceleration error (e.g, lateral "jerk" feeling) or forward/backward acceleration (e.g. "jerk forward" due to braking or "jerk back" feeling due to throttle use).

Raw data can be generated by analysis module 570 which can be used by visualization module 560 to generate plots and histograms of the raw data. Example plots of the raw data are described below with reference to FIGS. 9A-9D. Raw data and/or visualization data for plots and histograms can be stored in a standardized data format such as HDF4 or HDF5.

Analysis module 570 generates a standard set metrics for all ADV driving data, both simulated driving and actual road-test driving, after the source data 530 has been filtered by feature filtering 550. The standard set of metrics includes, for example, the following metrics computed from the filtered source data. The standard set of metrics can be organized into control performance metrics 572, safety metrics 574, sensation metrics 576, and usage metrics 578. The described set of standardized metrics is illustrative and non-exhaustive. Control performance 572 metrics are metrics that relate to performance of the ADV vehicle controller in accurately following station and heading information of a planned trajectory of an ADV route. Safety 574 metrics are metrics that relate to how safely the ADV is being navigated and can include the "worst case" control accuracy of station, speed, lateral position and heading control, and the control accuracy at some specific points, e.g., an end of route or end of a portion of a driving route, such as stopping for a pedestrian, a stop sign, a stop light, or a stopped vehicle.

Safety 574 metrics can also include indicating a distance away from obstacles (people, parked cars, etc.). Sensation 576 metrics can include how smoothly the ADV was driven, such as whether there is excessive pitch, roll, acceleration, bumpiness, sharp turning or braking, and the like. Usage 578 metrics can include indicating how large and how frequently control adjustments are made by the ADV controller to the steering, throttle, and braking control systems in the ADV controller's effort to maintain the station and heading of the trajectory of the ADV route. An example, illustrative, non-exhaustive set of metrics for evaluating performance of an ADV controller are described below, with reference to the following tables I through IV.

In the following tables, harsh driving conditions are driving conditions that are extraordinary, such as extreme traffic, unusually high amount of curves vs. straight-aways, unusually high amount of stop signs or traffic lights per unit distance of roadway. Quantitative thresholds for characterizing "harsh" driving conditions can be configurable in the control profiling system.

TABLE I

Control Performance Metric 572

| Metric | Description |
| --- | --- |
| Station_Err_Std | Standard deviation of error between actual and planned vehicle station. |
| Station_Err_Std_Harsh | Standard deviation of error between actual and planned vehicle station under harsh driving conditions. |
| Speed_Err_Std | Standard deviation of error between actual and planned vehicle speed. |
| Speed_Err_Std_Harsh | Standard deviation of error between actual and planned vehicle speed under harsh driving conditions. |
| Lateral_Err_Std | Standard deviation of error between actual and planned vehicle lateral position. |
| Lateral_Err_Std_Harsh | Standard deviation of error between actual and planned vehicle lateral position under harsh driving conditions. |
| Lateral_Err_Rate_Std | Standard deviation of rate of change of error between actual and planned vehicle lateral position. |
| Lateral_Err_Rate_Std_Harsh | Standard deviation of rate of change of error between actual and planned vehicle lateral position under harsh driving conditions. |
| Heading_Err_Std | Standard deviation of error between actual and planned vehicle heading. |
| Heading_Err_Std_Harsh | Standard deviation of error between actual and planned vehicle heading under harsh driving conditions. |
| Heading_Err_Rate_Std | Standard deviation of rate of change of error between actual and planned vehicle heading. |
| Heading_Err_Rate_Std_Harsh | Standard deviation of rate of change of error between actual and planned vehicle heading under harsh driving conditions. |

TABLE II

Safety Metric 574

| Metric | Description |
| --- | --- |
| Station_Err_Peak | Peak error between actual and planned vehicle station and its timestamp. |
| Speed_Err_Peak | Peak error between actual and planned vehicle speed and its timestamp. |
| Lateral_Err_Peak | Peak error between actual and planned vehicle lateral position and its timestamp. |
| Lateral_Err_Rate_Peak | Peak rate of change of error between actual and planned vehicle lateral position and its timestamp. |

TABLE II-continued

Safety Metric 574

| Metric | Description |
|---|---|
| Heading_Err_Peak | Peak error between actual and planned vehicle heading and its timestamp. |
| Heading_Err_Rate_Peak | Peak rate of change of error between actual and planned vehicle heading and its timestamp. |
| Ending_Station_Err_Trajectory_0 | Error between actual and planned ending station, for the ending point of a first planned trajectory. |
| Ending_Station_Err_Trajectory_1 | Error between actual and planned ending station, for the ending point of a second planned trajectory. |
| Ending_Station_Err_Trajectory_2 | Error between actual and planned ending station, for the ending point of a third planned trajectory. |
| Ending_Station_Err_Trajectory_3 | Error between actual and planned ending station, for the ending point of a fourth planned trajectory. |
| Ending_Lateral_Err_Trajectory_0 | Error between actual and planned ending lateral position, for the ending point of a first planned trajectory. |
| Ending_Lateral_Err_Trajectory_1 | Error between actual and planned ending lateral position, for the ending point of a second planned trajectory. |
| Ending_Lateral_Err_Trajectory_2 | Error between actual and planned ending lateral position, for the ending point of a third planned trajectory. |
| Ending_Lateral_Err_Trajectory_3 | Error between actual and planned ending lateral position, for the ending point of a fourth planned trajectory. |

TABLE III

Sensation (comfort) Metric 576

| Metric | Description |
|---|---|
| Acc_Bad_Sensation | Count of occurrences of actual > maximum threshold acceleration sensation (lateral, front/back, or vertical) |
| Jerk_Bad_Sensation | Count of occurrences of actual > maximum threshold "jerk" sensation (lateral, front/back, or vertical). |
| Heading_Acc_Bad_Sensation | Count of occurrences of actual > maximum threshold heading sensation (e.g. rapid heading change) |
| Heading_Jerk_Bad_Sensation | Count of occurrences of actual > maximum threshold heading sensation (e.g. harsh heading change) |

TABLE IV

Usage Metric 578

| Metric | Description |
|---|---|
| Throttle_Control_Usage | Standard deviation of percentage of throttle control usage, over time. |
| Throttle_Control_Usage_Harsh | Standard deviation of percentage of throttle control usage, over time, during harsh driving conditions. |
| Brake_Control_Usage | Standard deviation of percentage of brake control usage, over time during standard driving. |
| Brake_Control_Usage_Harsh | Standard deviation of percentage of brake control usage, over time, during harsh driving conditions. |
| Steering_Control_Usage | Standard deviation of percentage of steering control usage, over time. |
| Steering_Control_Usage_Harsh | Standard deviation of percentage of steering control usage, over time, during harsh driving conditions. |
| Throttle_DeadZone_Mean | Average amount of time between throttle command and throttle actuation. |
| Brake_DeadZone_Mean | Average amount of time between brake command and brake actuation. |
| Total_Time_Usage | Standard deviation of the percentage of control-module computation time over the unit sample time of a frame |
| Total_Time_Peak | Peak percentage of control-module computation time over the unit sample time of a frame |
| Total_Time_Exceeded_Count | Count of occurrences of control-module computation time > the unit sample time of a frame |

TABLE IV-continued

Usage Metric 578

| Metric | Description |
|---|---|
| Pose_Heading_Offset_Std | Standard deviation of the offset between location movement direction and IMU measured heading direction |
| Pose_Heading_Offset_Peak | Peak of the offset between location movement direction and IMU measured heading direction |

The following example illustrates a method of computing the metric "lateral_error_std." Other metrics are similarly calculated. Alternative algorithms may be used for the lateral_error_std ADV controller metric, $\mu_y$.

$$\mu_y = \sqrt{\sum_{i=0}^{N} \frac{(y_i - y_{des,i})^2}{(L_{wheelbase} * k_{des,i} * \dot{x}_{des,i} * \Delta t * n_{frame})^2} / N - 1},$$

where:

$y_i$ is the actual lateral position of the ADV at time increment i, $y_{des,i}$ is the planned lateral position of the ADV at time increment i, $L_{wheelbase}$ is the length of the wheelbase of the ADV, $k_{des,i}$ is the planned curvature of the trajectory of the ADV at time increment i, $\dot{x}_{des,i}$ is the planned longitudinal speed at time increment i, $\Delta t$ is the time between increments of i (i.e., sample time of a single frame), and $n_{frame}$ is a pre-defined number of frames of data.

Feedback to design model 580 can pass the visualization data 560 generated by analysis module 570 to simulation platform 510. Simulation platform 510 can receive the visualization data 560 and generate one or more plots or histograms from the visualization data 560. In an embodiment, the ADV controller type 538, for which analysis was performed by analysis module 570, can have one or more tunable parameters that modify corresponding characteristics of the ADV controller type. An updated ADV controller can be generated from inputs received from design engineers and/or changes to tunable parameters generated automatically by feedback to design model 580, utilizing the set of metrics generated by analysis module 570. Feedback to design model 580 can pass the set of metrics generated by analysis module 570, the visualization data 560, and any automatically generated proposed modifications for updating the ADV controller type from feedback to design model 580, to distribute results 590 module. Distribute results 590 module distributes the aforementioned information to design engineers for further analysis. Such analysis can result in an updated ADV controller having the ADV controller type.

Figure 6B:
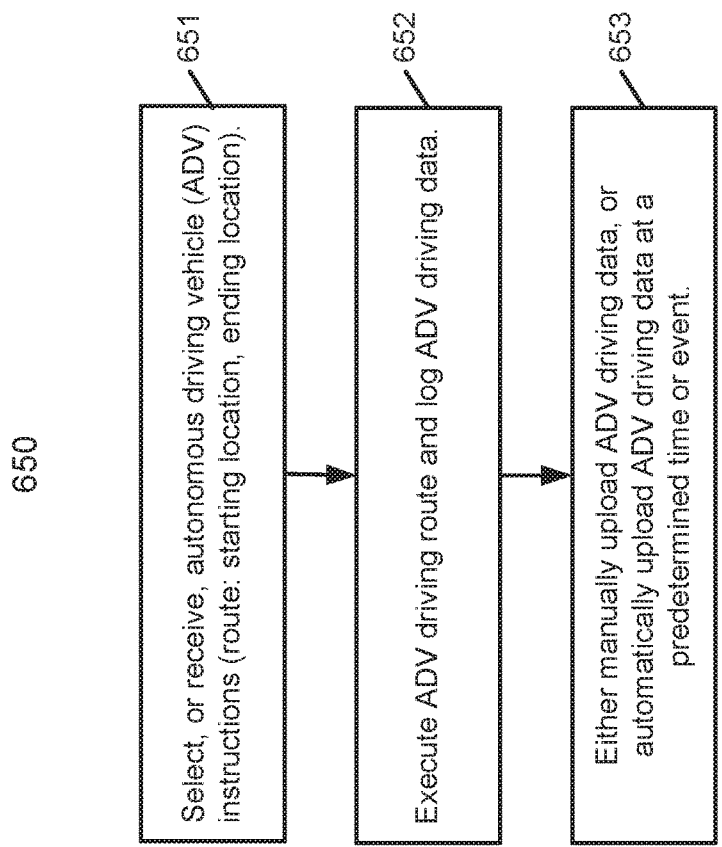
FIGS. 6A and 6B are block diagrams illustrating methods of collecting autonomous vehicle controller performance data, for use in generating standardized performance metrics of the controller, according to one embodiment.
Figure 6A:
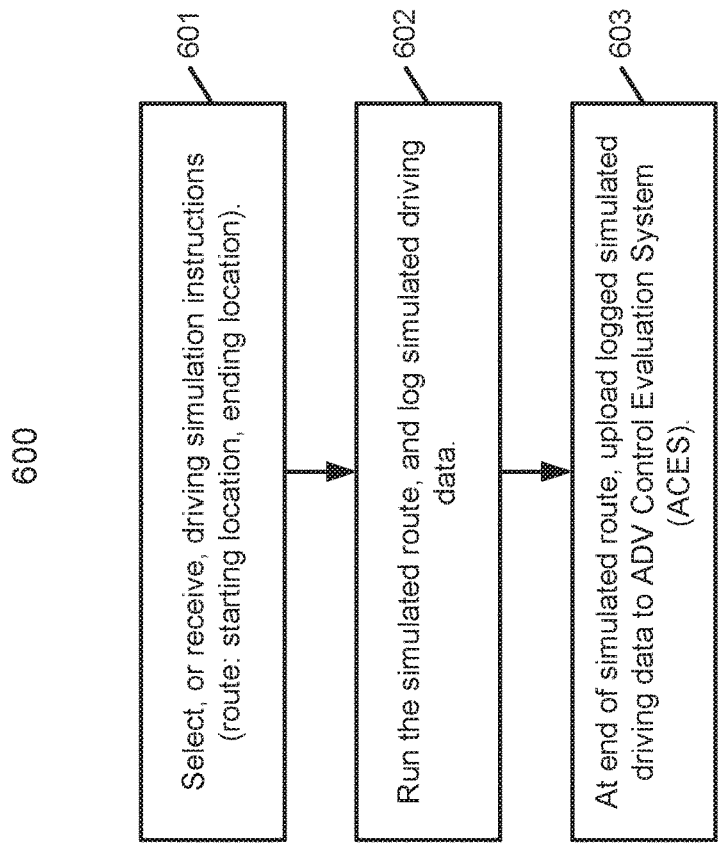

FIGS. 6A and 6B are block diagrams illustrating methods 600 and 650 of collecting autonomous vehicle controller performance data, for use in generating standardized performance metrics of the controller, according to one embodiment.

Referring now to FIG. 6A, a method 600 of generating and uploading driving data records of a simulated ADV driving session include, in operation 601, selecting or receiving driving simulation instructions for a simulated ADV driving session. Instructions can further include a selection of an ADV type and an ADV controller type for the simulated ADV driving session. The ADV driving instructions for the simulated ADV driving session can include a route having a starting location and an ending location.

In operation 602, the ADV simulated driving session can be started. As the simulated ADV driving session executes, ADV driving records can be generated and logged for the ADV type and ADV controller type for the simulated ADV driving session. Driving records for the simulated ADV driving session can be substantially identical to driving records generated by a real-world ADV of the same ADV type and ADV controller type as for the ADV simulated driving session.

In operation 603, when the simulated ADV driving session completes, the logged driving records for the simulated ADV driving session can be uploaded automatically as sourced data 530 to the data pipeline system 520. In an embodiment, the ADV simulation system 510 can alternatively receive a manual selection to upload driving records of the simulated ADV driving session to the data pipeline 520 via a user interface of the simulated ADV driving system 510. Method 600 ends.

Referring now to FIG. 6B, a method 650 of uploading driving records logged during one or more real-world ADV driving sessions includes receiving 651 a selection of an ADV driving route, including a starting location and an ending location. In an embodiment, the starting location can be a current location of the ADV, by default. The ADV has an ADV type and an ADV controller type. In operation 652, the ADV driving session begins. As the ADV route is being driving by the ADV, the ADV logs driving records related to the execution of the driving route by the ADV. In an embodiment, the ADV is being driven in autonomous driving mode.

In operation 653, ADV driving records are uploaded to the data pipeline 520 road-test data base 540 as road-test data 545. In an embodiment, the ADV driving records are uploaded to the data pipeline 520 at a predetermined time, e.g. 1:00 a.m. In an embodiment, the ADV driving records are uploaded to the data pipeline 520 in response to a user input to a user interface of the ADV. In an embodiment, the ADV driving records are uploaded to the data pipeline 520 in response to an event, such as the ADV arriving at the end location of a driving route. In an embodiment, the event is that that ADV has collected 100% of a predetermined amount of a driving data for a plurality of predetermined driving scenarios, such as a predetermined number of left turns, right turns, braking with pulses or taps, and the like. Method 650 ends.

Figure 7:
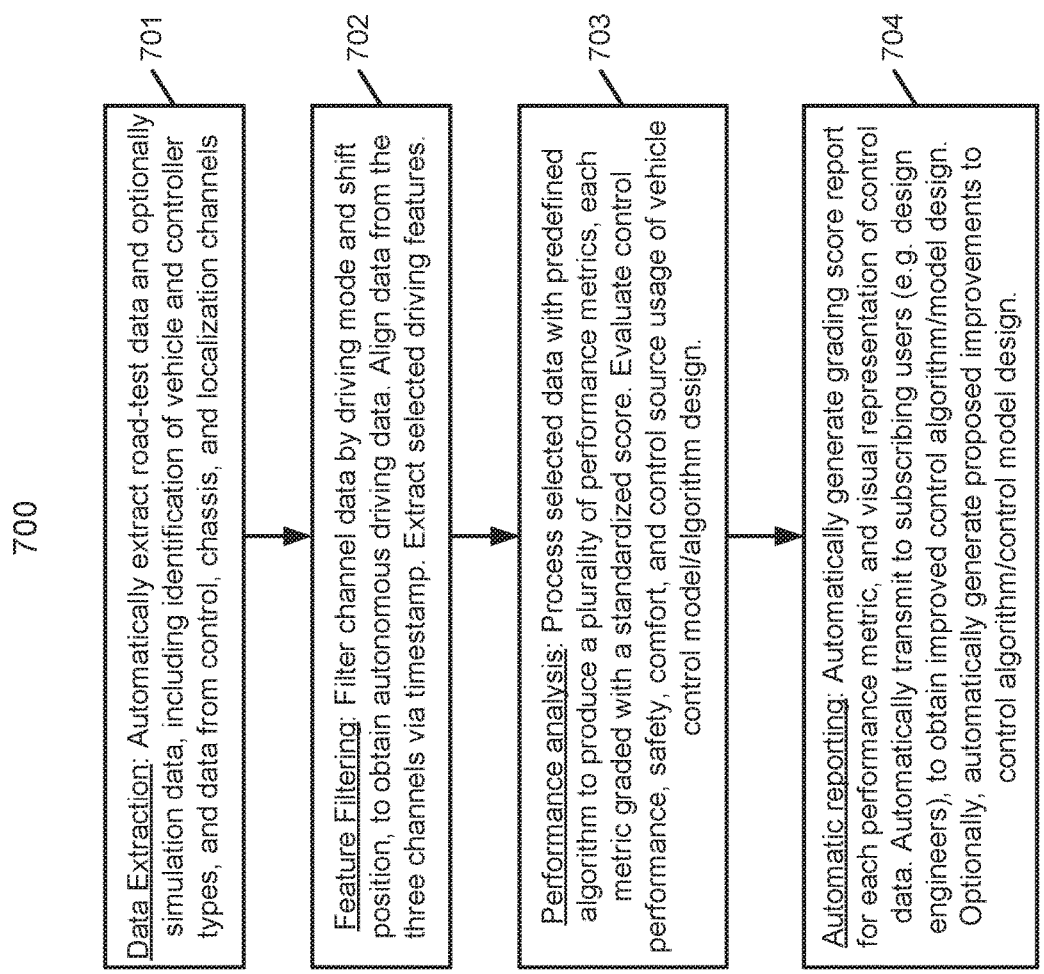
FIG. 7 is a block diagram illustrating a method of generating standardized performance metrics of an autonomous vehicle controller, for use in improving the autonomous vehicle controller, according to one embodiment.

FIG. 7 is a block diagram illustrating a method 700 of generating a set of standardized performance metrics of an autonomous driving vehicle (ADV) controller, for use in improving the autonomous vehicle controller, according to one embodiment. Method 700 can be practiced on a system such as ADV controller profiling system 500 described above with reference to FIG. 5.

In operations 701, a large plurality of ADV driving records are extracted from, e.g., source data 530 of the ADV controller profiling system. ADV driving records can include driving records for one, or both, of simulated ADV driving records and real-world ADV road-test driving records. In an embodiment, ADV driving records are extracted for a specified ADV type and ADV controller type. An ADV type can include a specified make and model of vehicle, as well as autonomous driving hardware system that controls the ADV in autonomous mode. The ADV controller type can be a model predictive controller (MPC) or a linear quadratic regulator (LQR) or hybrid of these. The ADV controller type can further be identified by ADV controller hardware revision level and software revision level, or other identifiers. The driving records are logged data during simulated or real-world ADV driving sessions, and include data from control information, chassis information, and localization information.

In operation 702, the extracted driving records can be filtered to include autonomous driving model driving data, and to exclude manual (human) driving data. Extracted driving records can further be filtered based upon a gearshift position of the ADV. Driving records can be filtered to include only driving records corresponding to a gearshift position of a forward driving gear or to include only driving records corresponding to a gearshift position of a reverse driving gear. In an embodiment, data records can be further filtered to exclude driving records corresponding to a gearshift position of "park" or "neutral." In an embodiment, driving records can be further filtered to exclude driving records corresponding to an ADV speed of zero miles per hour or zero kilometers per hours. The extracted driving records each have time stamp corresponding to a time t at which the data was recorded. For driving records of each ADV driving session, the driving records can be aligned by timestamp such that control information, chassis information, and localization information can be analyzed together based upon driving records related by time.

In operation 703, the ADV controller profiling system can generate a set of ADV controller performance metrics, as described above with relation to at least FIG. 5. The ADV controller profiling system uses a set of predefined algorithms to generate each of the predefined set of ADV controller metrics for the ADV type and ADV controller type. The metrics grade controller performance, safety, comfort, and control usage for the ADV type and ADV controller type.

In operation 704, the ADV controller profiling tool can generate a grading score report for each performance metric, and a visual representation of raw data used to generate the performance metrics. The report(s) and visual representation can be transmitted automatically to subscribing users (e.g. design engineers). In an embodiment, the ADV controller profiling tool can further generate suggested improvements for an updated ADV controller based upon the set of performance metrics and grading scores. Suggested improvements can be in the form of one or more suggested parameter changes to tunable portions of the ADV controller algorithm(s). Method 700 ends.

Figure 8:
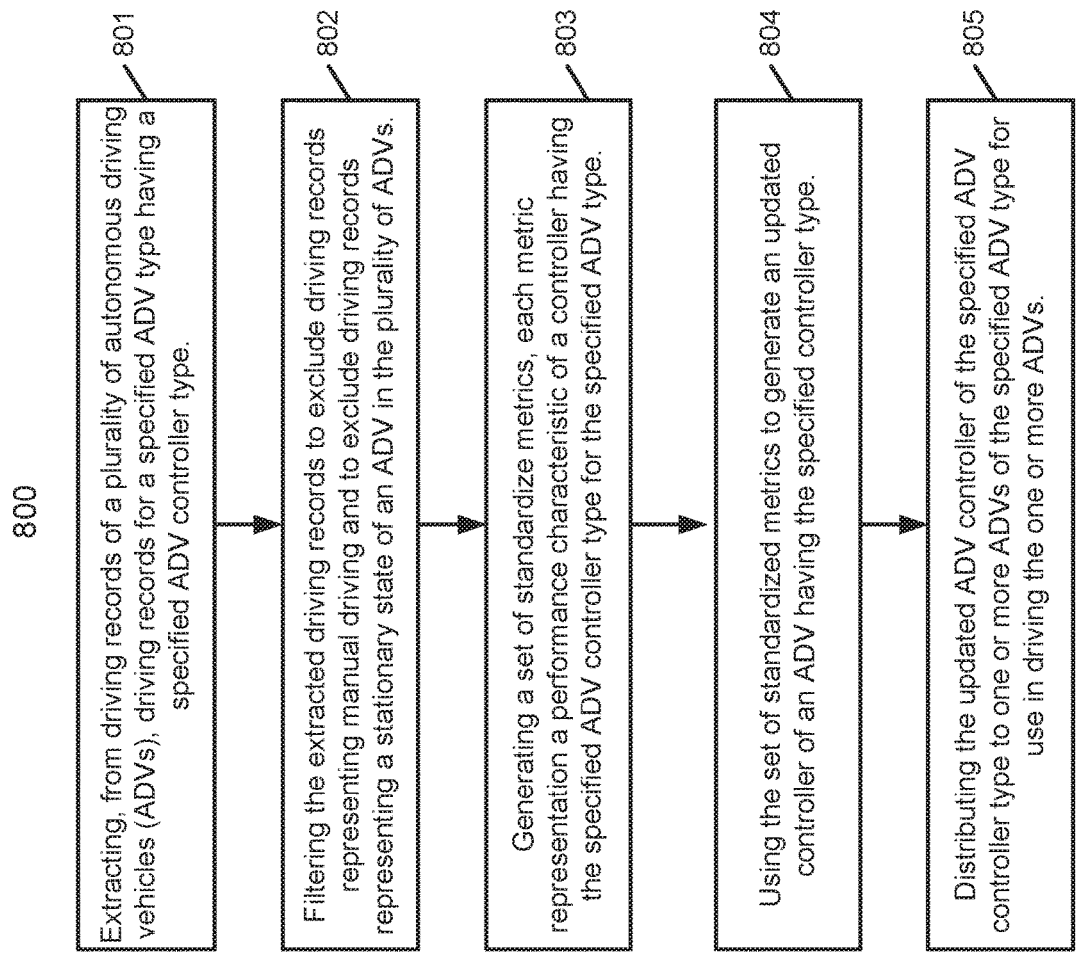
FIG. 8 is a block diagram illustrating a method of generating standardized performance metrics of an autonomous vehicle controller, for use in improving the autonomous vehicle controller, according to one embodiment.

FIG. 8 is a block diagram illustrating a method 800 of generating standardized performance metrics of an autonomous vehicle controller, for use in improving the autonomous vehicle controller, according to one embodiment.

In operations 801, a large plurality of ADV driving records are extracted from, e.g., source data 530 of the ADV controller profiling system. ADV driving records can include driving records for one, or both, of simulated ADV driving records and real-world ADV road-test driving records. In an embodiment, ADV driving records are extracted for a specified ADV type and ADV controller type. An ADV type can include a specified make and model of vehicle, as well as autonomous driving hardware system that controls the ADV in autonomous mode. The ADV controller type can be a model predictive controller (MPC) or a linear quadratic regulator (LQR), or hybrid of these. The ADV controller type can further be identified by ADV controller hardware revision level and software revision level, or other identifiers. The driving records are logged data during simulated or real-world ADV driving sessions, and include data from control information, chassis information, and localization information.

In operation 802, the extracted driving records can be filtered to include autonomous driving model driving data, and to exclude manual (human) driving data. Extracted driving records can further be filtered based upon a gearshift position of the ADV. Driving records can be filtered to include only driving records corresponding to a gearshift position of a forward driving gear or to include only driving records corresponding to a gearshift position of a reverse driving gear. In an embodiment, data records can be further filtered to exclude driving records corresponding to a gearshift position of "park" or "neutral." In an embodiment, driving records can be further filtered to exclude driving records corresponding to an ADV speed of zero miles per hour or zero kilometers per hours. The extracted driving records each have time stamp corresponding to a time t at which the data was recorded. For driving records of each ADV driving session, the driving records can be aligned by timestamp such that control information, chassis information, and localization information can be analyzed together based upon driving records related by time.

In operation 803, the ADV controller profiling system can generate a set of ADV controller performance metrics, as described above with relation to at least FIG. 5. The ADV controller profiling system uses a set of predefined algorithms to generate each of the predefined set of ADV controller metrics for the ADV type and ADV controller type. The metrics grade controller performance, safety, comfort, and control usage for the ADV type and ADV controller type.

In operation 804, the ADV controller profiling tool can use the set of standardized performance metrics to generate suggested improvements for an updated ADV controller for the ADV type and ADV controller type based upon the set of standardized performance metrics and grading scores. Suggested improvements can be in the form of one or more suggested parameter changes to tunable portions of the ADV controller algorithm(s). Method 700 ends.

In operation 805, the ADV controller profiling tool can distribute and updated ADV controller of the ADV controller type to one or more ADVs of the specified ADV type for using in driving the one or more ADVs. In an embodiment, the one or more ADVs can include one or more simulated ADVs. Method 800 ends.

FIGS. 9A-9D are example visualizations of raw data generated by a system that generates standardized performance metrics of an autonomous vehicle controller, for use in improving the autonomous vehicle controller, according to one embodiment.

Figure 9A:
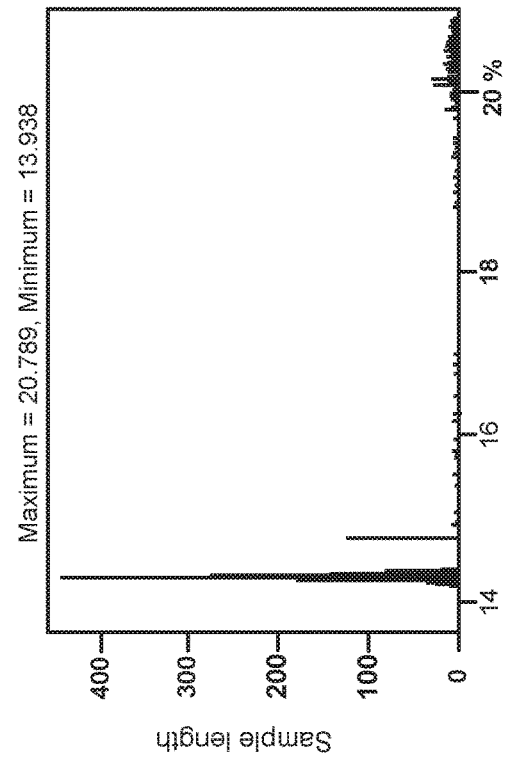
FIGS. 9A-9D are example visualizations of raw data generated by a system that generates standardized performance metrics of an autonomous vehicle controller, for use in improving the autonomous vehicle controller, according to one embodiment.

Referring now to FIG. 9A, FIG. 9A is a visual representation of raw data, in the form of a histogram, wherein the raw data is used to generate one or more metrics related to the performance ADV controller with respect to control of the throttle and actual throttle system responses reported by the chassis information channel of an ADV. During the whole of the driving routine, the minimum used throttle control action is approximately 15% of the fully-open throttle. Thus we identify that a throttle dead zone is 0-15% of the fully-open throttle.

Figure 9C:
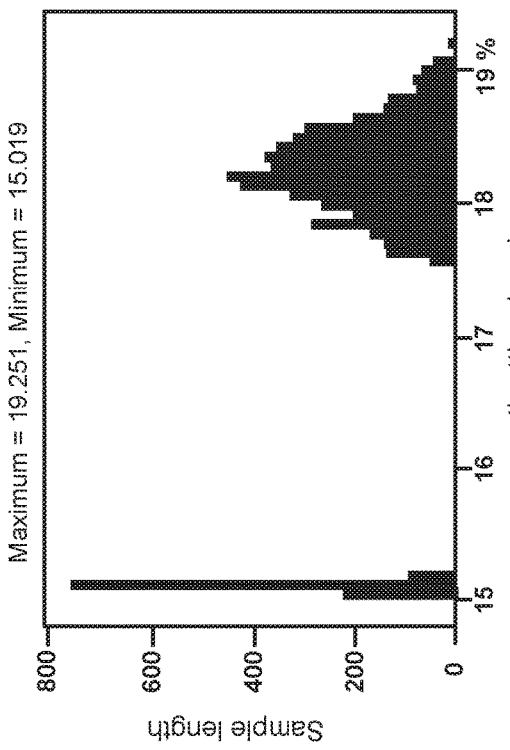
Figure 9B:
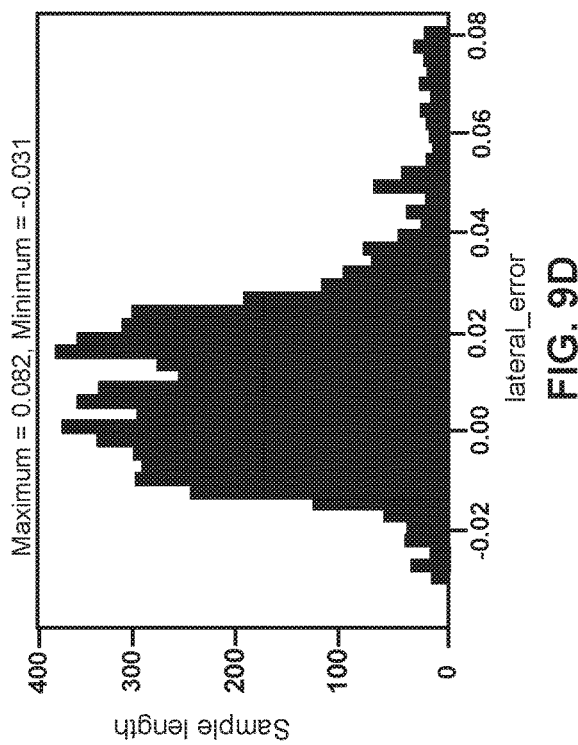

Referring now to FIG. 9B, FIG. 9B is a visual representation of raw data, in the form of a histogram, wherein the raw data is used to generate one or more metrics related to the performance ADV controller with respect to control of the braking system and actual braking responses reported by the chassis information channel of an ADV. During the whole of the driving routine, the minimum used brake control action is approximately 14% of the fully-locked brake. Thus we identify that a brake dead zone is 0-14% of the fully-locked brake.

Referring now to FIG. 9C, FIG. 9C is a visual representation of a localization heading angle error estimation, as a standard deviation of location movement direction vs. heading offset for the ADV type and ADV controller type (metric: pose_heading_offset_mean, pose_heading_offset_peak).

Figure 9D:
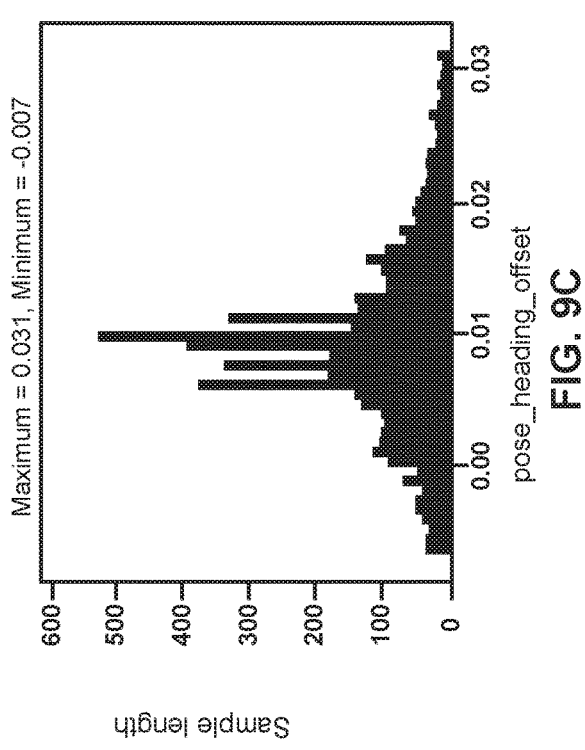

Referring now to FIG. 9D, FIG. 9D is a visual representation of raw data for a performance metric indicating lateral error between actual lateral position of an ADV (or simulated ADV) and a planned lateral position of the ADV (metric: lateral_error_std and lateral_error_std_harsh). As shown in FIG. 9D, the error ranges from a minimum of −0.031 meters to a maximum of 0.082 meters, with most errors falling with about −0.017 meters to 0.027 meters. The lateral error visualization is a quick visual indicator of the performance of the controller in controlling the lateral position of the ADV while navigating a route.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A computer-implemented method of improving an autonomous driving vehicle (ADV) control system, comprising:
    extracting, from driving records of a plurality of ADVs including a simulated ADV and a real ADV, driving records for a specified ADV type having a specified ADV controller type which includes a model predictive control (MPC) controller type, a linear quadratic regulator (LQR) controller type, or a hybrid controller type;
    filtering the extracted driving records to exclude driving records representing manual driving and to exclude driving records representing a stationary state of an ADV in the plurality of ADVs;
    generating a set of standardized metrics, each metric representing a performance characteristic of an ADV controller having the specified ADV controller type for the specified ADV type;
    using the set of standardized metrics to generate an updated ADV controller having the specified ADV controller type;
    performing a simulation with the simulated ADV with the updated ADV controller to test the updated ADV controller;
    distributing the updated ADV controller of the specified ADV controller type based on whether the specified ADV controller type is the MPC controller type, the LQR controller type, or the hybrid controller type, to one or more real ADVs of the ADV type, for use in driving the one or more ADVs; and distributing the updated ADV controller to the simulated ADV to perform one or more additional simulations with.

2. The method of claim 1, wherein the simulated ADV has an ADV type and an ADV controller type corresponding to the real ADV in the plurality of ADVs.

3. The method of claim 1, wherein the extracted driving records are further filtered to include driving records corresponding to a gearshift position of the ADV, wherein the gearshift position comprises one of a forward gear or a reverse gear position.

4. The method of claim 1, wherein the stationary state of the ADV is determined by at least one of:
 a gearshift position of the ADV being one of neutral or park; or
 a speed of the ADV being zero.

5. The method of claim 1, further comprising:
 aligning the extracted driving records for each ADV in the plurality of ADVs according to a timestamp of each extracted driving record.

6. The method of claim 1, wherein, for each ADV in the plurality of ADVs, the extracted records of driving data comprise:
 controller outputs to controlled systems of the ADV, including throttle, brakes, and steering, and including measured states of the controlled systems responsive to the controller outputs;
 state information of the chassis of the ADV, including pitch, roll, ADV incline, and forward and lateral acceleration; and
 location information indicating a planned location and heading of the ADV and an actual location and heading of the ADV, at a timestamp of the location information.

7. The method of claim 1, further comprising:
 generating visualization information from the extracted data records; and
 providing the visualization information to at least one of:
  a system that generates a report including plots and histograms of the visualization information; or
  a simulation system that generates one or more charts, histograms, or plots for display on the simulation system, using the visualization information.

8. The method of claim 1, further comprising:
 generating one or more suggested updates to the ADV controller, based upon the generated set of standardized metrics.

9. The method of claim 8, wherein the simulated ADV is run on a simulation system which generates a second set of standardized metrics based upon a second set of driving records generated by performing the simulation or the one or more additional simulations.

10. A non-transitory machine-readable medium having instructions stored therein, which when executed by a processor, cause the processor to perform operations, the operations comprising:
 extracting, from driving records of a plurality of ADVs including a simulated ADV and a real ADV, driving records for a specified ADV type having a specified ADV controller type which includes a model predictive control (MPC) controller type, a linear quadratic regulator (LQR) controller type, or a hybrid controller type;
 filtering the extracted driving records to exclude driving records representing manual driving and to exclude driving records representing a stationary state of an ADV in the plurality of ADVs;
 generating a set of standardized metrics, each metric representing a performance characteristic of an ADV controller having the specified ADV controller type for the specified ADV type;
 using the set of standardized metrics to generate an updated ADV controller having the specified ADV controller type;
 performing a simulation with the simulated ADV with the updated ADV controller to test the updated ADV controller;
 distributing the updated ADV controller of the specified ADV controller type based on whether the specified ADV controller type is the MPC controller type, the LQR controller type, or the hybrid controller type, to one or more ADVs of the ADV type, for use in driving the one or more ADVs; and
 distributing the updated ADV controller to the simulated ADV to perform one or more additional simulations with.

11. The medium of claim 10, wherein the simulated ADV has ADV type and a specified controller type corresponding to the real ADV in the plurality of ADVs.

12. The medium of claim 10, wherein the extracted driving records are further filtered to include driving records corresponding to a gearshift position of the ADV, wherein the gearshift position comprises one of a forward gear or a reverse gear position.

13. The medium of claim 10, the operations further comprising:
 aligning the extracted driving records for each ADV in the plurality of ADVs according to a timestamp of each extracted driving record, wherein, for each ADV in the plurality of ADVs, the extracted records of driving data comprise:
 controller outputs to controlled systems of the ADV, including throttle, brakes, and steering, and including measured states of the controlled systems responsive to the controller outputs;
 state information of the chassis of the ADV, including pitch, roll, ADV incline, and forward and lateral acceleration; and
 location information indicating a planned location and heading of the ADV and an actual location and heading of the ADV, at a timestamp of the location information.

14. The medium of claim 10, the operations further comprising:
 generating visualization information from the extracted data records; and
 providing the visualization information to at least one of:
  a system that generates a report including plots and histograms of the visualization information; or
  a simulation system that generates one or more charts, histograms, or plots for display on the simulation system, using the visualization information.

15. The medium of claim 10, the operations further comprising:
 generating one or more suggested updates to the ADV controller, based upon the generated set of standardized metrics wherein
 the simulated ADV runs on a simulation system using the updated ADV controller;
 and generates a second set of standardized metrics based upon a second set of driving records generated by performing the simulation or the one or more additional simulations.

16. A data processing system, comprising:
a processor; and
a memory coupled to the processor to store instructions, which when executed by the processor, cause the processor to perform operations, the operations including:
extracting, from driving records of a plurality of ADVs including a simulated ADV and a real ADV, driving records for a specified ADV type having a specified ADV controller type, which includes a model predictive control (MPC) controller type, a linear quadratic regulator (LQR) controller type, or a hybrid controller type;
filtering the extracted driving records to exclude driving records representing manual driving and to exclude driving records representing a stationary state of an ADV in the plurality of ADVs;
generating a set of standardized metrics, each metric representing a performance characteristic of an ADV controller having the specified ADV controller type for the specified ADV type;
using the set of standardized metrics to generate an updated ADV controller having the specified ADV controller type;
performing a simulation with the simulated ADV with the updated ADV controller to test the updated ADV controller;
distributing the updated ADV controller of the specified ADV controller type based on whether the specified ADV controller type is the MPC controller type, the LQR controller type, or the hybrid controller type, to one or more real ADVs of the ADV type, for use in driving the one or more ADVs; and
distributing the updated ADV controller to the simulated ADV to perform one or more additional simulations with.

17. The system of claim 16, wherein the simulated ADV has an ADV type and a specified controller type corresponding to the real ADV in the plurality of ADVs.

18. The system of claim 16, wherein the extracted driving records are further filtered to include driving records corresponding to a gearshift position of the ADV, wherein the gearshift position comprises one of a forward gear or a reverse gear position.

19. The system of claim 16, the operations further comprising:
aligning the extracted driving records for each ADV in the plurality of ADVs according to a timestamp of each extracted driving record, wherein, for each ADV in the plurality of ADVs, the extracted records of driving data comprise:
controller outputs to controlled systems of the ADV, including throttle, brakes, and steering, and including measured states of the controlled systems responsive to the controller outputs;
state information of the chassis of the ADV, including pitch, roll, ADV incline, and forward and lateral acceleration; and
location information indicating a planned location and heading of the ADV and an actual location and heading of the ADV, at a timestamp of the location information.

20. The system of claim 19, the operations further comprising:
generating visualization information from the extracted data records; and
providing the visualization information to at least one of:
a system that generates a report including plots and histograms of the visualization information; or
a simulation system that generates one or more charts, histograms, or plots for display on the simulation system, using the visualization information.

21. The system of claim 16, the operations further comprising:
generating one or more suggested updates to the ADV controller, based upon the generated set of standardized metrics, wherein
the simulated ADV runs on a simulation system which generates a second set of standardized metrics based upon a second set of driving records generated by performing the simulation or the one or more additional simulations.

* * * * *